United States Patent
Solovyov

(10) Patent No.: US 10,938,128 B2
(45) Date of Patent: Mar. 2, 2021

(54) SUPERCONDUCTING INTERCONNECTS WITH ULTRA-LOW THERMAL CONDUCTIVITY

(71) Applicant: Brookhaven Technology Group, Inc., Stony Brook, NY (US)

(72) Inventor: Vyacheslav Solovyov, Rocky Point, NY (US)

(73) Assignee: Brookhaven Technology Group, Inc., Stony Brook, NY (US)

(*) Notice: Subject to any disclaimer, the term of this patent is extended or adjusted under 35 U.S.C. 154(b) by 0 days.

(21) Appl. No.: 16/865,040

(22) Filed: May 1, 2020

(65) Prior Publication Data

US 2020/0350709 A1    Nov. 5, 2020

Related U.S. Application Data

(60) Provisional application No. 62/841,341, filed on May 1, 2019.

(51) Int. Cl.
*H01R 4/68* (2006.01)
*H05K 9/00* (2006.01)
*H01L 39/12* (2006.01)
*H02G 15/34* (2006.01)

(52) U.S. Cl.
CPC ............. *H01R 4/68* (2013.01); *H01L 39/128* (2013.01); *H02G 15/34* (2013.01); *H05K 9/0077* (2013.01)

(58) Field of Classification Search
CPC ............................. H05K 9/0077; H01R 4/68
See application file for complete search history.

(56) References Cited

FOREIGN PATENT DOCUMENTS

WO    WO2014/125694    *    8/2014    .......... H05K 9/0077

* cited by examiner

*Primary Examiner* — Jeremy C Norris
(74) *Attorney, Agent, or Firm* — Schroeder Law PC

(57) ABSTRACT

Superconducting interconnects with ultra-low thermal conductivity capable of providing a direct connection between a millikelvin temperature environment and a 70 K temperature environment.

19 Claims, 18 Drawing Sheets

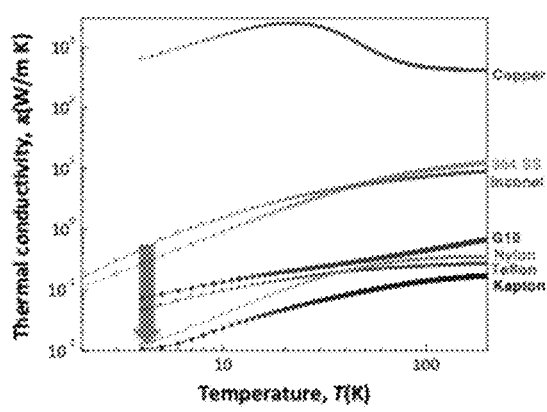 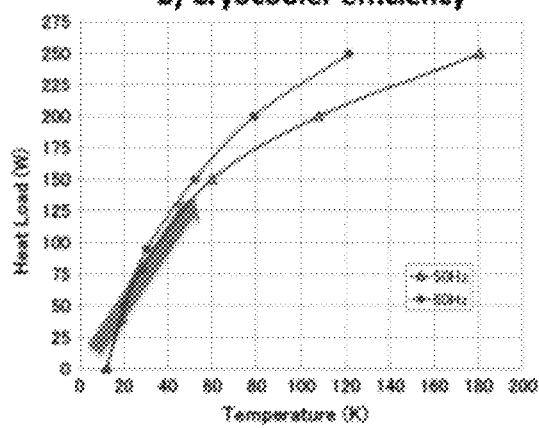
FIG. 2A            FIG. 2B
Fig. 2a - The arrow shows reduction of the interconnect conduction loss that will be accomplished in the present invention. Fig. 2b - The arrow shows the efficiency gain realized by placing the interface electronics at 70 K.

FIG. 7A - Attachment of the temporary support
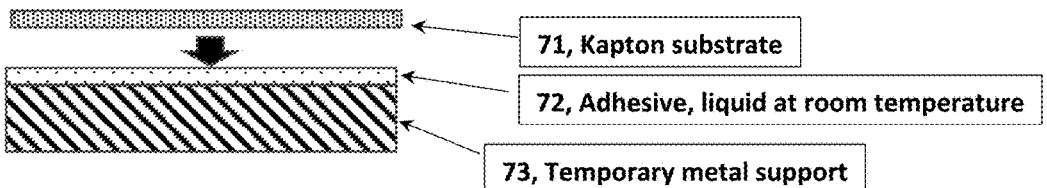
FIG. 7B - Attachment of the YBCO layer to Kapton substrate (transfer lamina)
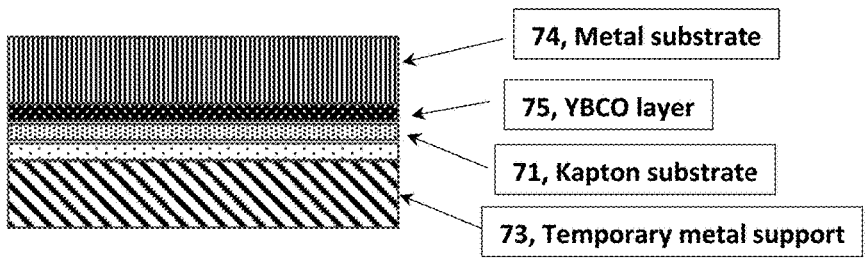
FIG. 7C - Cryogenic separation of the metal substrate
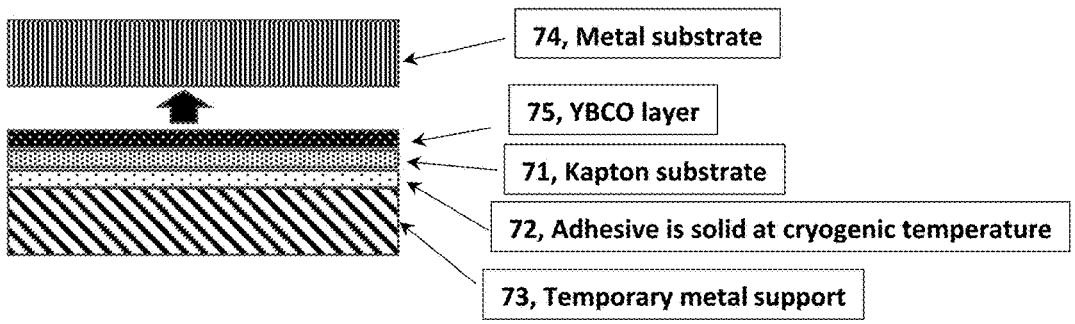
FIG. 7D - Room temperature separation of the Kapton transfer lamina from the temporary support
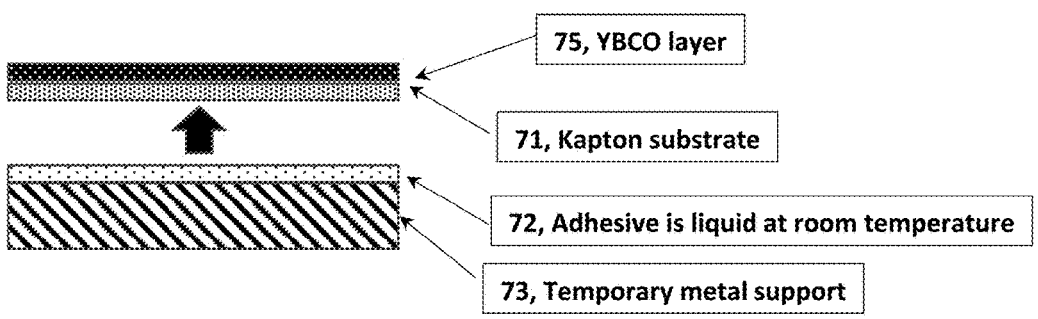

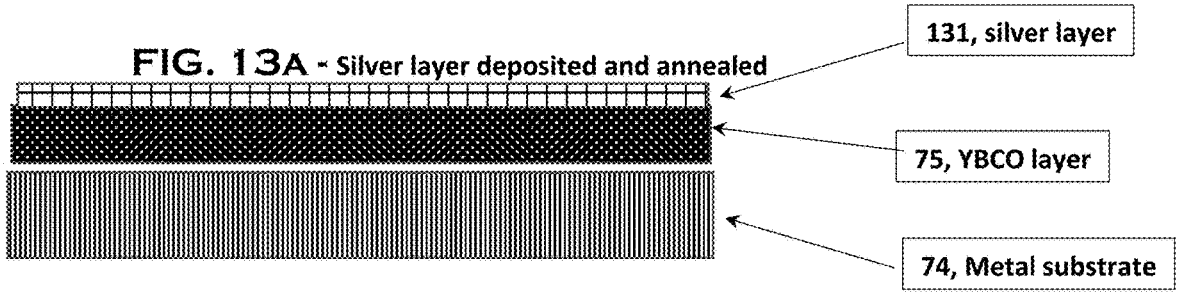
FIG. 13A - Silver layer deposited and annealed
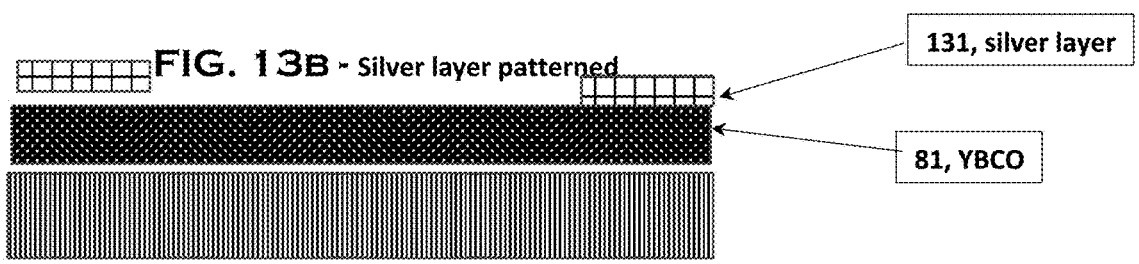
FIG. 13B - Silver layer patterned
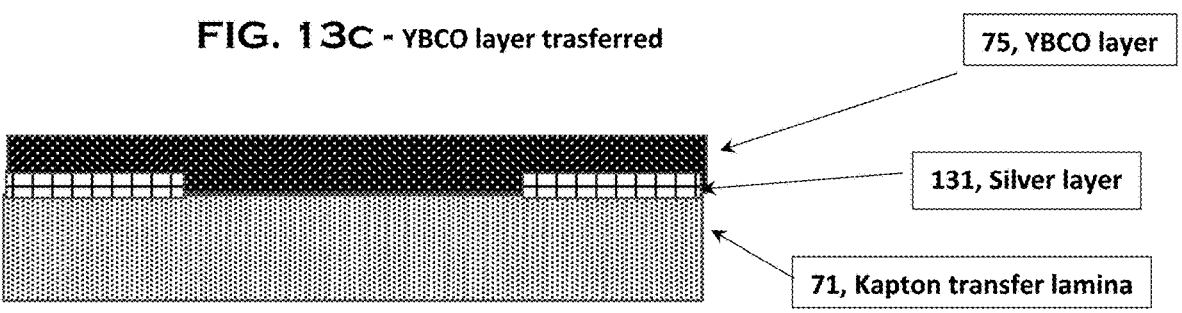
FIG. 13C - YBCO layer trasferred
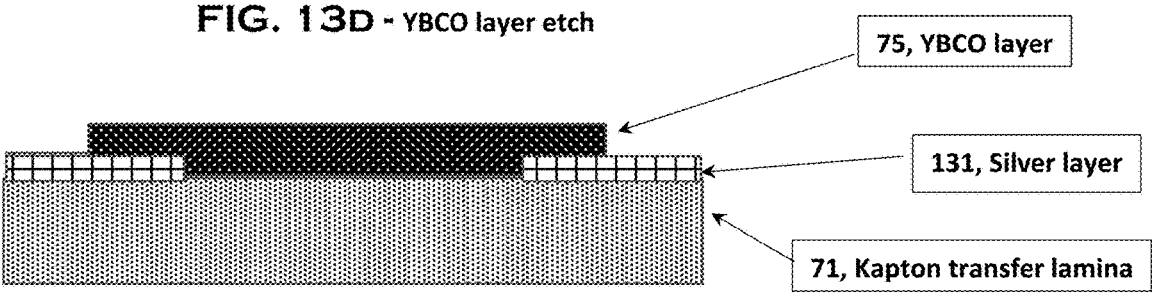
FIG. 13D - YBCO layer etch FIG. 15A
FIG. 15B
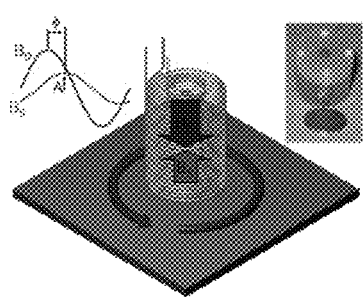
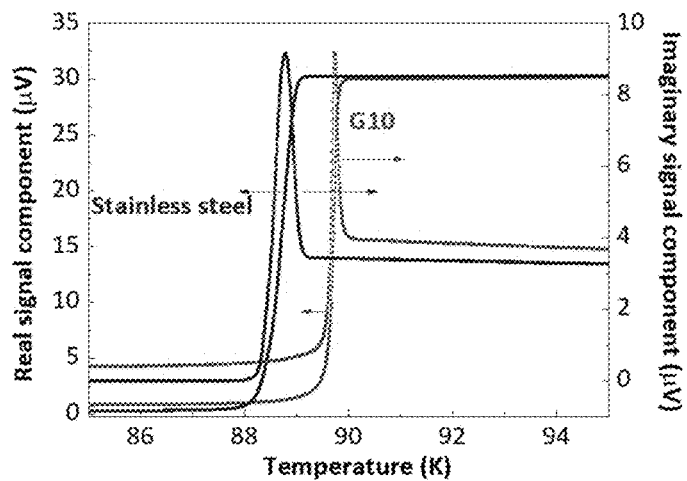

FIG. 16A - YBCO lines
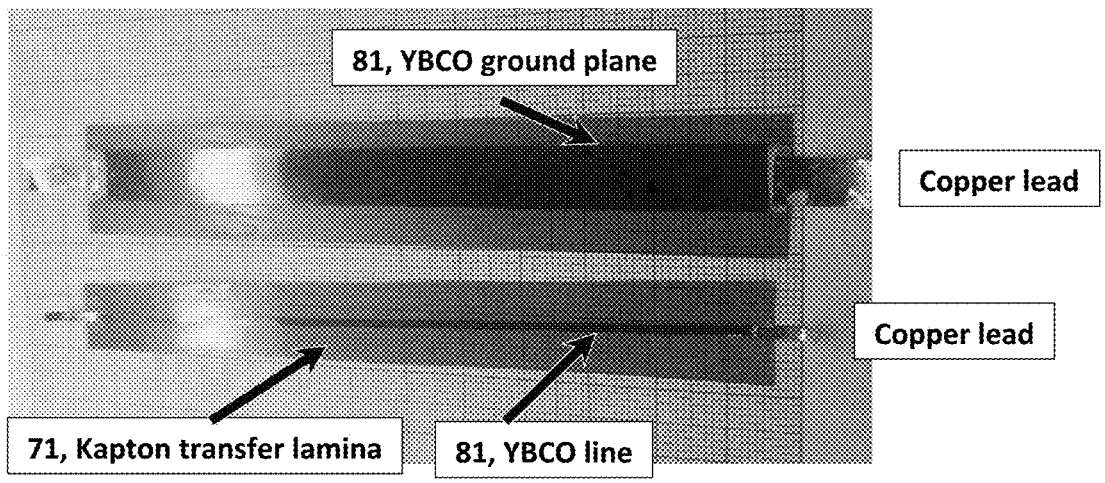
FIG. 16B - Dielectric separator attached to the ground plane
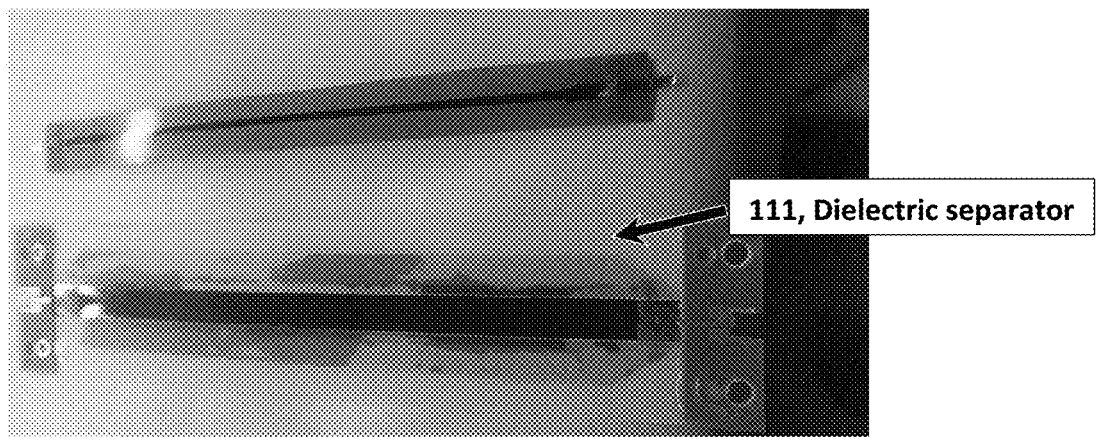
FIG. 16C - Assembled microstrip
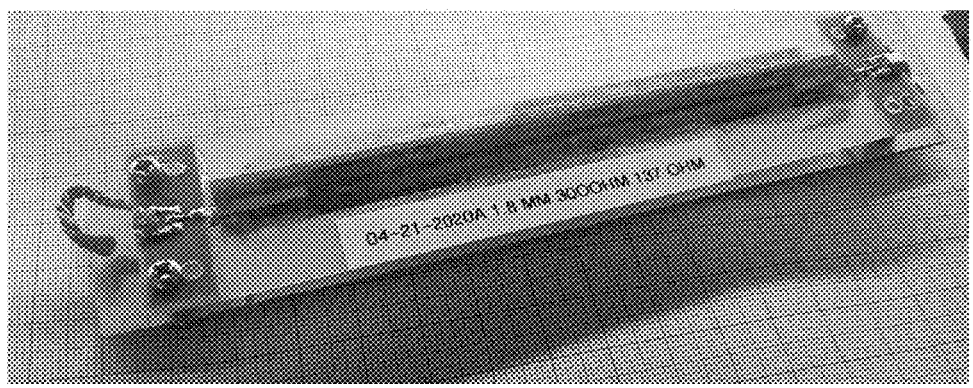

SUPERCONDUCTING INTERCONNECTS WITH ULTRA-LOW THERMAL CONDUCTIVITY

BACKGROUND OF THE INVENTION

The present invention relates to the efficient transmission of electrical signals and electrical power between temperature levels in a cryogenic environment. More particularly, the present invention relates to the interconnection of signals in Superconducting Quantum Information System (sQIS) applications such as in a quantum computer, the delivery of electrical signals to cryogenic equipment such as photon detectors, and the supplying of electrical current to superconducting magnets.

Currently sQIS are implemented in a variety of ways: trapped ion atoms, atomic-size impurities, and superconducting resonators coupled with Josephson junctions. Superconducting quantum information systems, which operate in an extreme millikelvin (mK) temperature environment, are considered the most promising near-term realization of the quantum information concept.

Those skilled in the art will recognize that the relatively low error rate of current sQIS (i.e., gate error of $1.8 \times 10^{-2}$ and readout error of $5.4 \times 10^{-2}$ which has been reported for the IBM Q 20 Tokyo system) is still not adequate for a practical quantum computer. Due to the intrinsically probabilistic nature of quantum computation, a large number of superconducting elements will be needed to build a system with a logical error probability $<10^{-12}$, which is considered as a benchmark of a QIS that is substantially superior to a classical solution. A very large number of physical elements, or qubits, need to be synchronized and pre-set to perform an error-free quantum computation and this will require a very large number of interconnects to carry signal and control voltages to the qubits.

Scaling the number of qubits by, for example, a factor of 1,000, will increase the number of coaxial lines in the quantum computer proportionally, resulting in a very dense and bulky system. Besides increasing the system size, the interconnects made of normal metal impose a high heat load on the system. Good conductors, such as copper, maintain high thermal conductivity down to several kelvins, which is explained as heat transfer by electrons. A solution is needed to decouple the electrical signals and heat transfer that are inherent when conventional conductors are used. For example, an optimized Wiedemann-Franz metal conductor, such as a coaxial line, delivers approximately 10 µW/A of heat from 50 K into >4 K stage when operating in DC mode. At frequencies >10 GHz, a conventional coaxial line imposes an insertion loss of 20-30 dB/m, primarily due to conduction loss. The combined thermal and insertion losses of 1,000's of signal and bias lines easily exceeds the capacity of the standard dilution refrigerator technology that must be used to operate in the <4K temperature range.

U.S. Pat. No. 10,141,493 discloses interconnects made from low temperature superconductors (LTS) such as niobium (Nb), which can reduce the heat load associated with conventional coaxial lines. The '493 patent teaches that Nb can be deposited as a polycrystalline film directly on a low thermal conductivity polymer substrate, such as a Type E Kapton film. However, other superconducting materials, e.g., high temperature superconductors made from rare earth barium copper oxide, cannot be deposited on a polymer substrate because the high-temperature superconducting phase YBCO forms at temperature above about 700° C., far exceeding the allowable temperature of a polymer. The '493 patent teaches that Nb becomes superconductive at a temperature below about 9.2 K. This of course requires the use of expensive and inefficient cryocoolers to achieve such temperatures. It also requires that any system using Nb-based superconducting lines include electronics and/or switches to move the electrical signals from the Nb superconducting lines to conventional coaxial lines as the temperature approaches the critical temperature for Nb. This movement of the electrical signals from the Nb superconducting lines to the conventional coaxial lines is typically done at a temperature of about 4 K. Those skilled in the art will appreciate that Si-based electronics do not operate at such low temperatures, thereby requiring that more expensive and less desirable electronics (e.g., high electron mobility transistor HEMT Ga—As electronics) be used in such applications.

There is therefore a need in the art for superconducting interconnects with ultra-low thermal conductivity which are capable of providing a direct connection between a millikelvin temperature environment and a 70 K temperature environment.

SUMMARY OF THE INVENTION

The present invention, which addresses the needs of the prior art, relates to superconducting interconnects with ultra-low thermal conductivity. The interconnects include a first ultra-low thermal conductivity polymeric substrate. The interconnects further include a plurality of discreet high temperature superconducting lines bonded to the first substrate with an adhesive. The interconnects further include a high temperature superconducting layer having first and second sides, the first side of the high temperature superconducting layer positioned to face the superconducting lines. The interconnects further include a second ultra-low thermal conductivity substrate bonded to the second side of the high temperature superconducting layer. Finally, the interconnects include a dielectric positioned between and separating the discreet high temperature superconducting lines from the high temperature superconducting layer.

The present invention further relates to a method of manufacturing superconducting interconnects with ultra-low thermal conductivity. The method includes the steps of providing a first ultra-low thermal conductivity substrate; bonding a first high temperature superconducting layer to the first substrate; etching a plurality of discreet transmission lines within the first high temperature superconducting layer along the length thereof; applying a dielectric coating to cover the discrete transmission lines; providing a second ultra-low thermal conductivity substrate having a second high temperature superconducting layer bonded thereto; and joining the first and second substrates such that the second high temperature superconducting layer is positioned adjacent the dielectric coating.

As a result, the present invention provides superconducting interconnects with ultra-low thermal conductivity which are capable of providing a direct connection between a millikelvin temperature environment and a 70 K temperature environment.

The present invention also delivers benefits in applications in which a large number of electrical signals need to be supplied to a cryogenic device, for example a photon detector, or in which a high level electrical current needs to be supplied to a superconducting magnet or another high-current superconducting machine. In such applications, it is very desirable to deliver electrical signal/current without conduction and Joule heating loss.

BRIEF DESCRIPTION OF THE DRAWINGS

FIG. 2a is a graph showing the thermal conductivity vs temperature for various metals and dielectrics.

FIG. 2b is a graph showing heat loss vs. temperature for a typical cryocooler operating at either 50 Hz or 60 Hz.

FIGS. 7a-7d show a transfer process utilizing a temporary metal support.

FIGS. 13a-13d show a process of making an electrical contact to the YBCO line.

FIG. 15a is a drawing showing a mutual inductance setup.

FIG. 15b is a graph showing the real signal component vs. temperature for a YBCO layer transferred to a G10 substrate and for a YBCO layer transferred to a stainless substrate.

FIGS. 16a-16c show the assembly of an air-gapped microstrip.

DETAILED DESCRIPTION OF THE INVENTION

This invention relates to superconducting interconnects having a plurality of discreet superconducting transmission lines positioned on a substrate with ultra-low thermal conductivity. The transmission lines combine the electrical conductivity of the superconductor with low (<1 dB/m) insertion loss in the 5-10 GHz range and ultra-low thermal conductivity when operating between 70 K temperature environments and mK environments, e.g., <20 mK.

In one preferred embodiment, the invention uses a high temperature superconducting ("HTS") material such as yttrium barium copper oxide (YBCO), which is epitaxially grown on a metal substrate, and then exfoliated from such metal substrate and transferred to a substrate with ultra-low thermal conductivity, e.g., low-loss dielectric substrates such as liquid crystal polymer (LCP) laminates, polyimide films or glass epoxy laminates. The thermal loss is thus reduced by a factor of 10, to 3 µW for a 10 mm wide, 100 conductor transmission line when operating in the 70 K to mK temperature range. For DC bias applications, the proposed interconnect will reduce the DC current load by at least 100×, down to 10 µW/A. For RF signal applications, the 10 GHz insertion loss is expected to remain below 1 dB/m for a 50 Ω 100-300 µm wide interconnect, which is 20× lower than copper.

Figure 1:
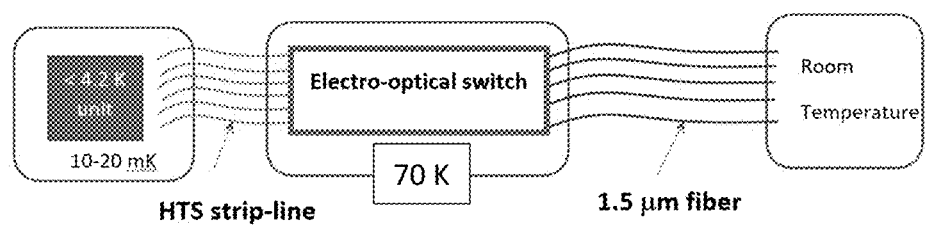
FIG. 1 is a schematic drawing showing the high temperature superconducting interconnects of the present invention providing a direct connection between a 4 K (or less) temperature environment and a 70 K temperature environment, and showing conventional optical fibers providing the connection between the 70 k temperature environment and room temperature.

As illustrated in FIG. 1, the interconnects described herein having transmission lines made of HTS materials will provide direct interconnects between 70 K and mK environments at a much greater density than available lines such as coaxial cables. Such a scheme allows the use of inexpensive off-the-shelf silicon electronics to complete the data connection to room temperature. Moreover, the much higher (20×) cryo-cooling efficiency at 70 K will permit a compact and less expensive cooling system.

Epitaxial growth requires both high (>700° C.) temperature, and a suitable epitaxial substrate. Today, large area, high quality YBCO films are routinely manufactured in the production of second generation (2G) tape. The films are grown on metal substrates, such as Ni or Hastelloy. A protective silver layer is then applied over the superconducting film, and, in turn, a copper stabilizing film is placed over the superconducting layer to sandwich the superconducting layer between the substrate and stabilizing layer to create the mentioned 2G tape. Even though these tapes demonstrate good microwave properties, the supporting metal substrate and metal stabilizing layer introduce high heat conduction and thermal losses. Moreover, the silver coating commonly applied to the exposed surface of the superconducting layer would also increase heat conduction and thermal losses.

It has been discovered herein that the ~1 µm YBCO layer of a tape structure without the silver layer and without the stabilizing layer can be exfoliated from the tape structure and adhered to a substrate with ultra-low thermal conductivity. In this regard, the exfoliated YBCO layer is a highly flexible superconducting ceramic material with ultra-low thermal conductivity. Once adhered to the ultra-low thermal conductivity substrate, and processed as described herein, the present invention provides superconducting interconnects having transmission lines with ultra-low thermal conductivity over the entire temperature range from 70 K to the mK temperature range.

In one preferred embodiment, a high quality epitaxial YBCO layer is transferred onto a substrate with ultra-low thermal conductivity, such as a thin layer of Kapton film (manufactured by DuPont) or a laminated crystal polymer (LCP, manufactured by Rogers Corrporation) film or a glass epoxy laminate. FIGS. 2a and 2b show the improvement expected in thermal conductivity and cryocooler power requirement when a standard commercially-available coated conductor rare earth barium copper oxide (ReBCO) tape on metal substrate is compared to an exfoliated ReBCO layer adhered to a Type E Kapton film. The thermal conductivity per unit of length is reduced by approximately 100×. Additionally, the dielectric substrate can be specifically chosen for low loss tangent, thus significantly reducing the insertion loss of the interconnect.

In one embodiment, the transmission lines of the interconnect are manufactured by using the process shown in FIGS. 3 to 12. In this process, two separate ultra-low thermal conductivity substrate assemblies are prepared, and then subsequently joined together in the final step.

Preparation of the first substrate assembly begins with providing a HTS tape 10 having the structure defined hereinbelow. Tape 10 includes a metal substrate 12 and an oxide buffer 14 on which a YBCO layer 16 is epitaxially grown (see FIG. 3). Tape 10 does not include a protective coating, e.g., silver, over YBCO layer 16 and does not include a stabilizing layer sandwiching YBCO layer 16 between such stabilizing layer and substrate 12.

Figure 4:
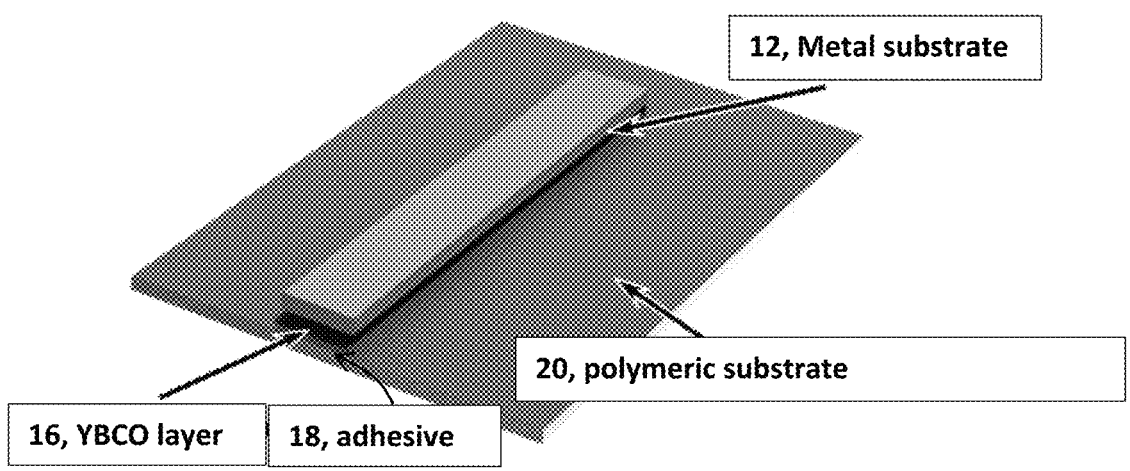
FIG. 4 is a perspective view showing the tape of FIG. 3 (YBCO layer facing down) being bonded to a first polymeric substrate.

In the next step, an adhesive 18 (such as a cryogenic epoxy, e.g., Stycast 1266) is used to bond tape 10 (YBCO layer facing down) to the first ultra-low thermal conductivity polymeric substrate 20 (see FIG. 4). The ultra-low thermal conductivity substrate 20 may be made of Kapton, Liquid Crystal Polymer, or other suitable materials. It is desirable to retain the high-critical current density and the original $T_c$ of the YBCO layer 16 after the transfer. The bonding process may be accomplished by applying a thin, e.g., 25 µm or less, of adhesive 18 on substrate 20. Tape 10 (YBCO layer facing down) is then positioned to contact adhesive 18 on substrate 20. The assembly is placed in a vacuum bag and vacuum is applied for 20-60 min to ensure a bubble-free attachment.

Figure 5:
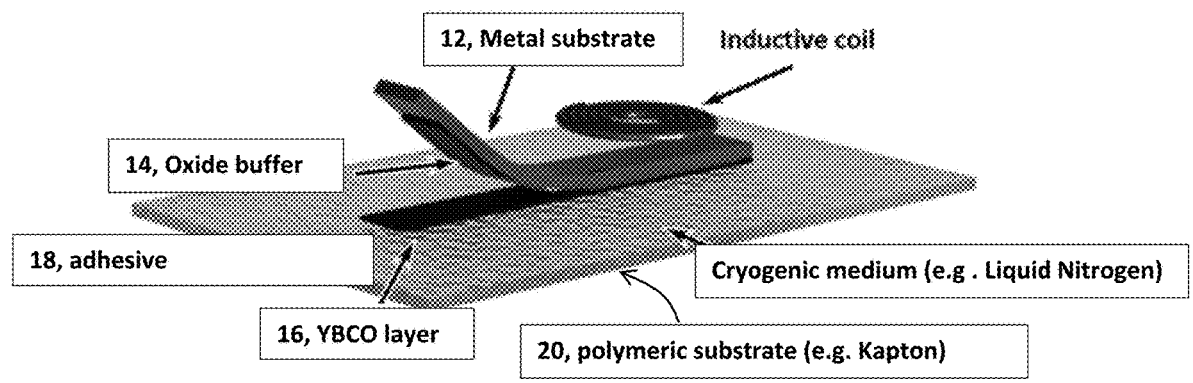
FIG. 5 is a perspective view showing the metal substrate and oxide buffer of the tape of FIG. 3 being exfoliated from the YBCO layer.
Figure 6:
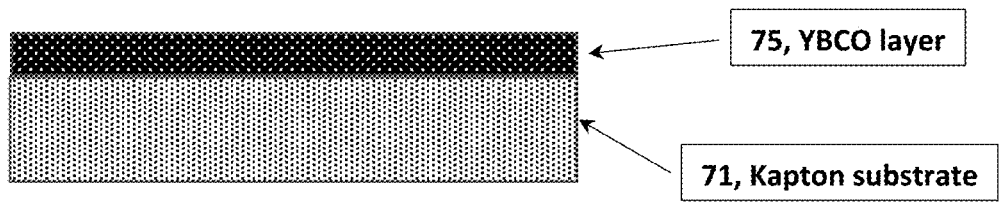
FIG. 6 is an elevational view of the structure of FIG. 5 after exfoliation of the metal substrate and oxide buffer.

Next, the metal substrate 12 and oxide buffer 14 are removed from the YBCO layer 16 in an exfoliation step. FIG. 5 shows one method which uses thermal shock to exfoliate the metal substrate and oxide buffer from the YBCO layer. In this method, the tape 10 and substrate 20 are cooled to cryogenic temperature after which the metal substrate 12, which in one embodiment is a Ni alloy, is rapidly heated by an inductive coil. The cryogenic temperature may be reached by immersing the assembly into a bath of liquid Nitrogen or solid carbon dioxide. The rapidly-heated metal substrate 12 expands, thus creating shearing stress on the YBCO-metal substrate interface. The YBCO layer 16 cleanly detaches from the metal substrate 12, while remaining attached to the first ultra-low thermal conductivity polymeric substrate 20. This detachment of the oxide buffer and metal substrate from the YBCO layer occurs because of the low, 50 MPa, adhesion strength of the YBCO layer to the surface of the buffer/metal substrate. In this way, the YBCO layer 16 is transferred to the ultra-low thermal conductivity polymeric substrate 20 (see FIG. 6).

The process of exfoliation is based on release of mechanical strain energy stored in mechanically bonded layers of materials with dissimilar coefficient of thermal expansion (CTE). Upon cooling the two-layer material compressive strain builds up in a layer with higher CTE. If the energy released by relaxation of the compressive strain in the transfer lamina is higher than bonding energy of the film, the delamination occurs.

It is also well known that mechanical energy U stored in the mechanically strained per unit area layer is:

$$U = \tfrac{1}{2} E \varepsilon^2 \qquad (1)$$

Where t is the layer thickness, E is Young's (elastic) modulus and s is strain. Young's modulus of Kapton is relatively low, 2.5 GPa, which implies that elastic energy in a thin Kapton substrate may not be sufficiently high to cause delamination of YBCO layer. In contrast, Young modulus of the Hastelloy metal substrate is 220 GPa, that is approximately 100 times higher than Kapton. Eq. 1 implies that the elastic energy is proportional to the transfer lamina thickness. It is expected that is a straight transfer of YBCO layer on a polymeric substrate would stop working once a critical lamina thickness is reached.

Table 1 compares room temperature CTE and relative elongation values for YBCO, various metals and Kapton. Traditionally, the metal substrate is chosen so that CTE of the metal closely matches that one of YBCO. For example, SuperPower Inc. formulation of the 2G tape uses Hastelloy 276 and AMSC Corp. is using Nickel. Both these metals have CTE that closely matches that of YBCO. Clearly CTE of Kapton is approximately twice as high as that of YBCO, thus potentially enabling the compressive delamination of YBCO layer from the metal substrate.

TABLE 1

|  | CTE $10^{-6}$/K | dL(%) at 4.2 K | dL(%) at 77 K |
|---|---|---|---|
| Hastelloy 276 | 11.2 | −0.3 | −0.26 |
| Aluminum | 22 | −0.42 | −0.4 |
| Copper | 16.5 | −0.32 | −0.31 |
| Stainless 304 | 17 | −0.3 | −0.29 |
| Iron | 11 | −0.22 | −0.21 |
| Nickel | 13.6 | −0.2 | −0.195 |
| Kapton | 20 | −0.48 | −0.46 |
| YBCO | 9 | −0.2 | −0.21 |

If the delamination process cannot be accomplished with the polymeric substrate alone, the transfer lamina can be temporarily attached to a thick sheet of metal (temporary support) with CTE lower than the metal substrate using an adhesive media, as shown in FIG. 7a. The adhesive media, 72, used to attach the polymeric substrate (further Kapton), 71, to the temporary support, 73. The adhesive 72 stays liquid or semi-solid at room temperature by rapidly solidifies upon cooling to a cryogenic temperature, which could be for example Liquid Nitrogen (77 K) or solid Carbon Dioxide (194 K). The temporary support material and thickness can be adjusted to generate desired level of compression in the metal substrate and accomplish controlled delamination of YBCO layer. Any metal listed in Table 1 can be used as the temporary support. Thus, the temporary support is capable of generating sufficient compressive strain in the metal substrate 74 so that energy released after detachment of the substrate from the YBCO layer is greater than the adhesion energy of YBCO-substrate interface. Next, the YBCO layer, 75 on a metal substrate, 74 is permanently attached to the Kapton substrate 71 using a cryogenic epoxy, FIG. 7b. After quench to cryogenic temperature, the metal substrate 74 releases the compressive thermal strain by cleanly detaching from the YBCO layer 75, FIG. 7c. After the temporary support is warmed to room temperature, FIG. 7d, the adhesive media becomes liquid again, thus allowing for easy detachment of the Kapton transfer lamina with the YBCO layer from the temporary support.

Figure 8:
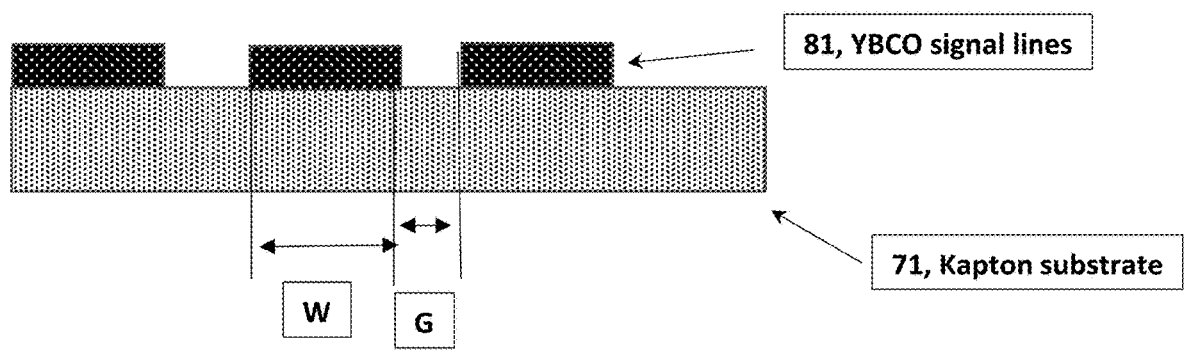
FIG. 8 is an elevational view similar to FIG. 7 after marking and etching of the discreet transmission lines in the YBCO layer.

Next, parallel lines are patterned and etched into the YBCO layer 75 using, for example, contact photolithography, to produce a plurality of discreet signal lines 81 in the YBCO layer (see FIG. 8). Photolithography is a technology used in the semiconductor industry for the manufacture of electronic components. In one preferred embodiment, the etching is performed using a Bromine etch, i.e., an alcohol solution of 5% Bromine or Iron Chloride in water solution. Alternatively, a pulsed laser can be used to ablate the YBCO layer and form the transmission line pattern. Pulsed laser wavelength is chosen so that the laser radiation is transparent to the transfer lamina material by is readily absorbed by the YBCO layer. It is well known that dielectric materials, such as Kapton, have are transparent to radiation between 0.8 and 1.5 microns. In one embodiment a pulsed fiber laser with wavelength 1.06 microns is used to pattern the YBCO layer into signal lines 81. In another preferred embodiment, the discreet transmission lines 81 are formed substantially parallel to one another with the outermost signal lines defining a width W (see FIG. 10). In still another preferred embodiment, the signal lines 81 are spaced apart a distance G of from about 20 μm to about 3,000 μm. In one particularly preferred embodiment, the transmission lines 81 are spaced apart a distance of about 20 μm. In another preferred embodiment, each of the discreet transmission lines 81 are formed with a substantially rectangular cross-section having a width from about 20 μm to about 1,000 μm. The height of the transmission lines 22 is defined by the thickness of the high temperature superconducting layer. The width and height are chosen to provide a transmission line with its impedance that is matched to the desired value. In one preferred embodiment, the desired impedance is 50Ω, which is a typical value for commonly-available electronics. In other embodiments, the impedance would be selected for that particular application. For example, the width and height could be chosen to provide a transmission line with an impedance of 30Ω or 75Ω, or some other desired value.

Figure 9:
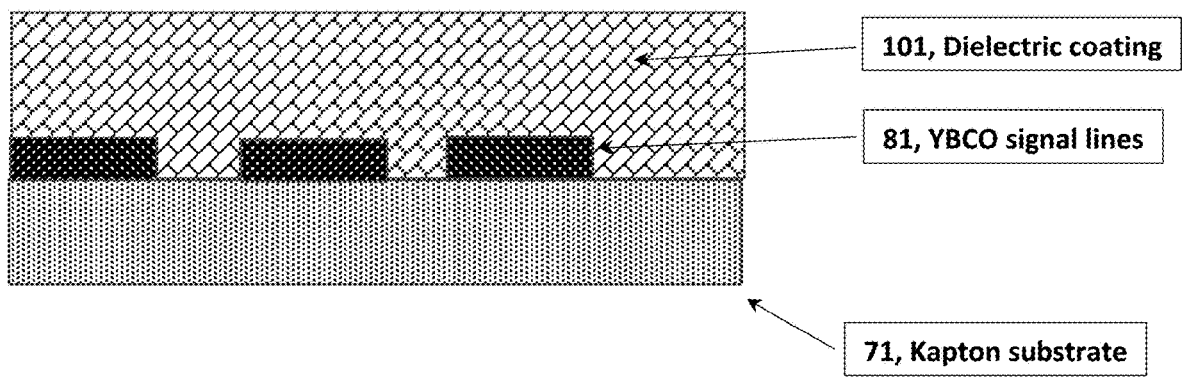
FIG. 9 is an elevational view similar to FIG. 8 after application of a dielectric coating.
Figure 10:
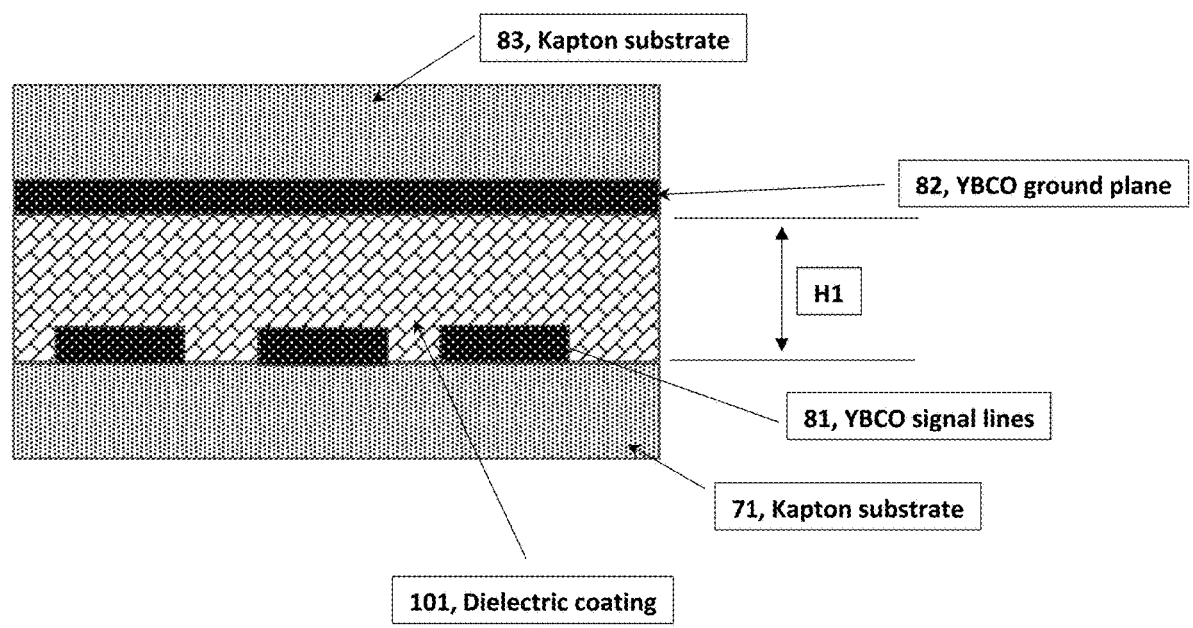
FIG. 10 is an elevational view similar to FIG. 9 after a second substrate/YBCO assembly is attached to the first substrate/YBCO layer.

This step is followed by application of a thin dielectric coating 24 using a spin coating procedure (see FIG. 9). Spin coating is a technology used in microfabrication processes. The coating 101 may be cured by using thermal or UV curing. The coating thickness, together with the width of the transmission line and separation gap, are factors in establishing the overall impedance of the interconnect.

Following the spin coating procedure, the first substrate 71 is trimmed to substantially conform to the overall dimensions of the etched, superconducting layer. A second assembly including a second ultra-low thermal conductivity substrate 83 and a second YBCO layer 82 (ground plane) is prepared by bonding the YBCO layer to the second substrate. The YBCO layer 82 bonded to the second substrate 83 is not etched—rather, it is left unetched and functions as a ground plane when the second assembly is attached to the first assembly (see FIG. 10).

Figure 11:
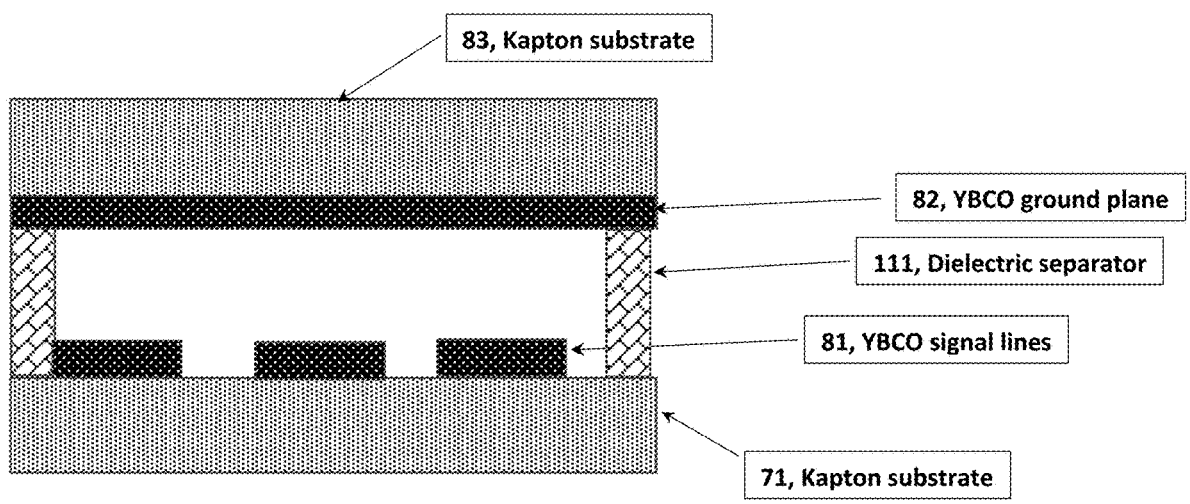
FIG. 11 is an elevational view of a dielectric microstrip transmission line assembled by bonding Kapton substrates.
Figure 12:
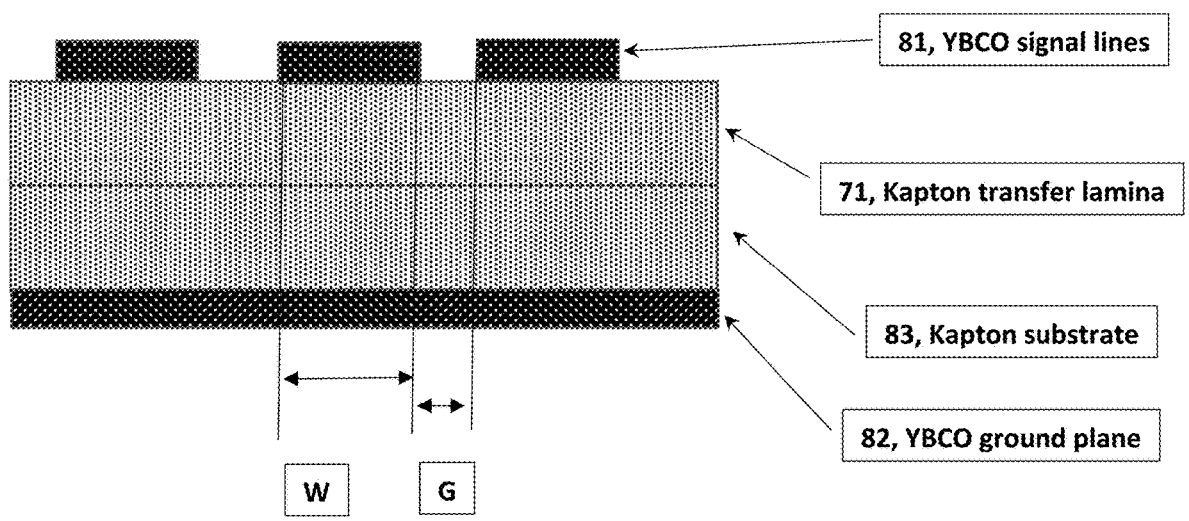
FIG. 12 is an elevational view of a dielectric microstrip transmission line assembled by bonding Kapton substrates.

Other variants of the transmission lines are shown in FIGS. 11-12. FIG. 11 shows an air-gapped microstrip, where the desired separation between the ground plane, 82 and signal lines, 82, is achieved by placing a dielectric separator 111 of appropriate thickness. FIG. 12 shows a dielectric-filled microstrip where the Kapton transfer laminas 71 provide separation between the signal line and the ground plane.

In application utilizing YBCO materials, it is desirable/necessary to have a reliable electrical contact to the YBCO layer. A silver layer is commonly used as an interface between the YBCO layer and common metal conductors such as copper. The silver layer is traditionally deposited by a physical deposition method, such as magnetron sputtering or thermal evaporation. The freshly-deposited silver layer has poor adhesion to the YBCO, requiring an annealing step, which is performed in an atmosphere of oxygen at 400-500° C. It would be obviously impossible to perform this step once the YBCO layer is transferred to the Kapton layer, because Kapton starts to decompose at 300° C. The process shown in FIG. 13 involves etching of the desired silver metallization prior to the transfer step (FIG. 13*a-b*). After the transfer is accomplished (FIG. 13*c*), the YBCO layer is etched revealing silver pads. Metal conductors can be attached to the silver pads by soldering or wire bonding.

High carrier density is important to minimize the kinetic inductance contribution, a phenomenon related to the high carrier mobility in superconductors. A high portion of kinetic inductance will result in the total impedance depending on the local carrier density and, more importantly, on the local temperature. The YBCO film, which is ~1 μm thick, is much thicker than the penetration depth of YBCO, 0.16 μm. The published data on kinetic inductance contribution in YBCO suggest that the effect is <1% for lines wider than 10 μm. Accordingly, the impedance of the transmission line is defined primarily by the geometry.

Example 1

Figure 3:
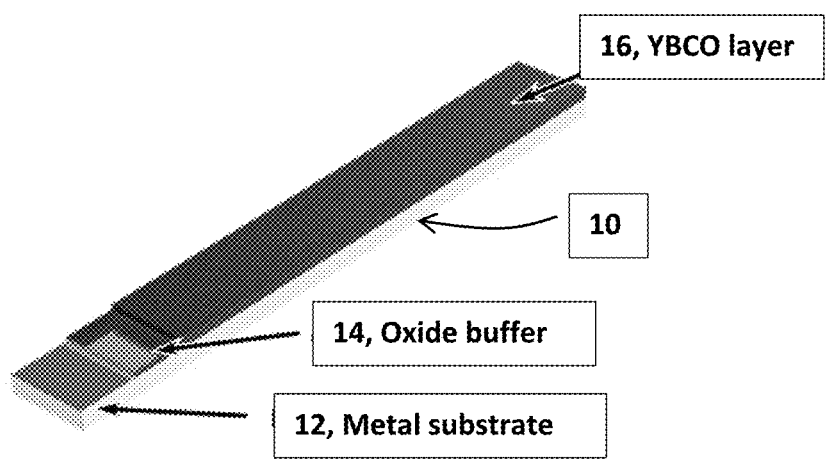
FIG. 3 is a perspective view of a high temperature superconducting tape structure in accordance with the present invention.
Figure 14:
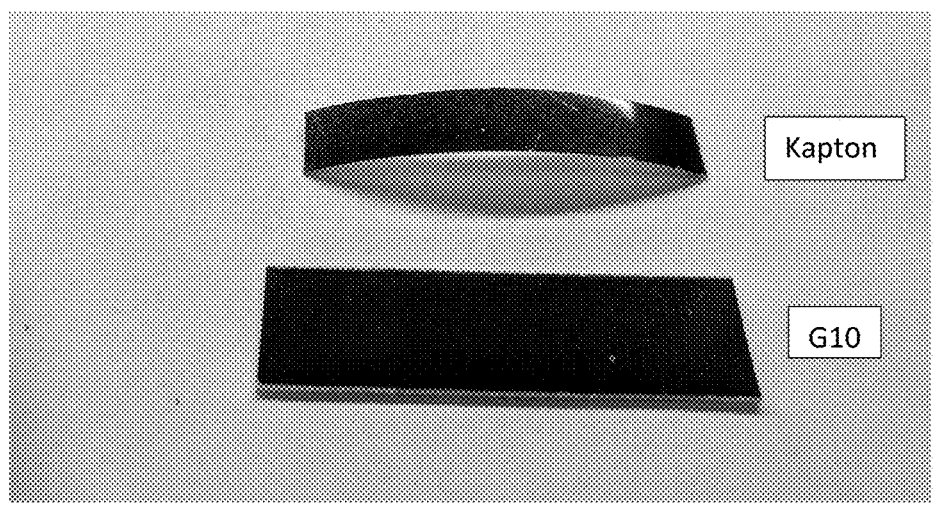
FIG. 14 is a photograph showing YBCO films adhered to a G10 substrate and to a Kapton film.

To demonstrate that a high temperature superconducting layer of YBCO grown on a metal substrate can be bonded to a dielectric and then thermally stressed to facilitate the exfoliation of the buffer and metal substrate, a 12 mm wide coupon of HTS tape according to the structure of FIG. 3 was bonded to 1) a 0.1 mm thick G10 foil and 2) to a 25 μm thick Kapton film using Stycast 1266 epoxy. Both assemblies were placed in a vacuum bag and at least 10 inches of vacuum was pulled on the assembly. After vacuum evacuation, the bond was cured at 50° C. for 10 hrs. The assemblies were quenched to liquid nitrogen temperature to generate thermal stress. In both cases, the metal substrate was removed, leaving the YBCO layer attached to the G10 and Kapton carriers, as shown in FIG. 14.

The critical temperature of the superconducting YBCO layer after transition of the YBCO layer to the G10 substrate was measured by the mutual inductance technique (see FIG. 15*a*). Briefly, the technique measures the intensity of the superconducting screening current as a function of film temperature.

FIG. 15*b* shows that the YBCO layer on the G10 substrate exhibits a remarkably high superconducting transition temperature (i.e., 90 K) compared to a YBCO layer adhered to a 316L stainless steel layer which exhibits a superconducting transition temperature of 88 K.

Example 2

Figure 17:
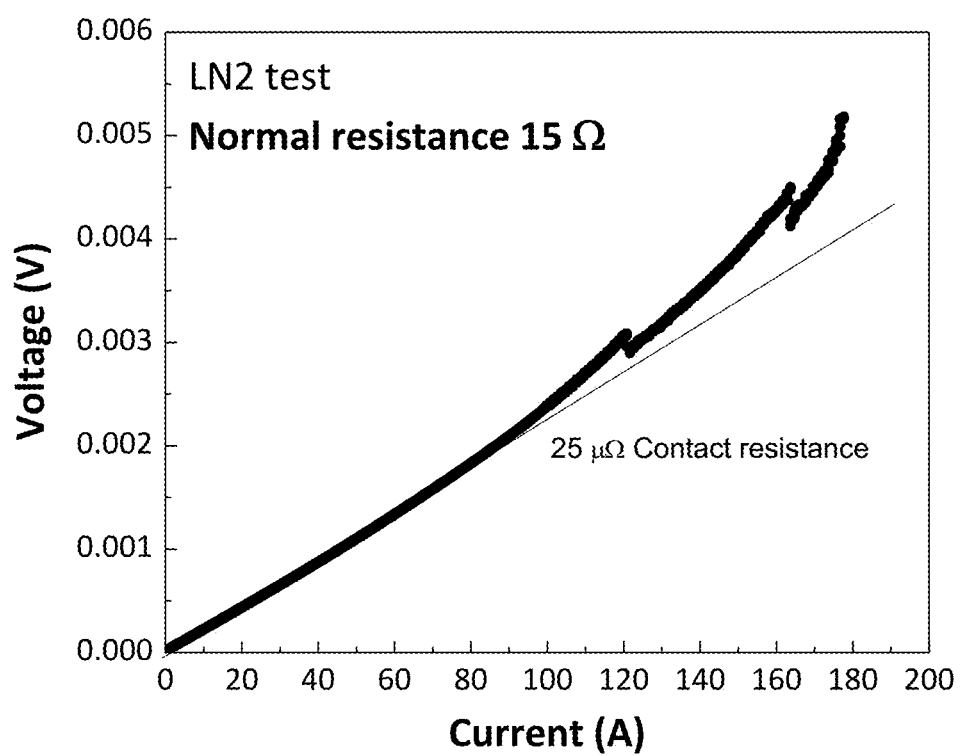
FIG. 17 is a current-voltage curve of the ground-plane YBCO layer shown in FIG. 16.

FIG. 16 shows YBCO layers transferred to 5 mil (0.125 mm) thick, 15 cm long, Kapton tape using the process shown in FIG. 7. A signal line, 1.8 mm wide was etched using a fiber laser, SPI 70 w model equipped with a ScanLab Intelliscan 14 scan-head. The line is calculated to have 50 W impedance at 0.33 mm air-gap separation. The separation is realized by attaching G10 strips to the edges of the ground plane. Copper foil leads are attached to silver contact with a tin-based solder. Contact resistance of the ground plane connection was confirmed by measuring a current-voltage curve at 77 K (FIG. 17). The YBCO layer sustained current up to 200 A, thus confirming that the transfer process did not compromise the integrity of the superconductor. The assembled microstrip, shown in FIG. 16*c*, was tested at 77 K. Signal and ground lines detected 230Ω and 33Ω at room temperature, respectively. After cooling to 77 K resistance of both lines registered less than 0.1). The insertion loss at 5 GHz was measured using an Agilent 2552A network analyzer. The line showed less than 0.1 dB loss at 5 GHz.

Example 3

Figure 18:
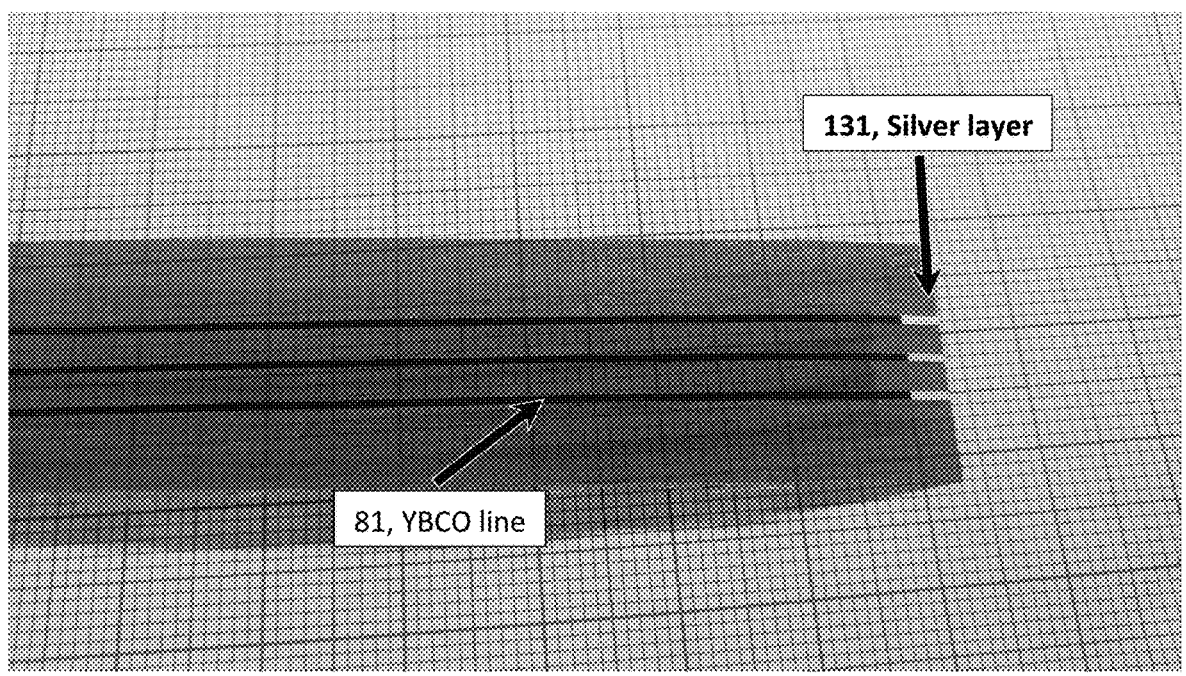
FIG. 18 is an array of 0.8 mm wide YBCO signal lines transferred to 5 mil (0.125 mm) thick Kapton using the process depicted in FIG. 7.

FIG. 18 shows 0.8 mm wide lines, 3 mm apart, etched from a 12 mm wide YBCO layer. The silver contacts 131 were prepared by the etching process shown in FIG. 13. The lines had room-temperature resistance ranging from 450 to 650Ω, the resistance dropped below 0.2Ω on cooldown to 77 K. The lines were used to manufacture a dielectric-filed microstrip as the one shown in FIG. 12.

What is claimed is:

1. Superconducting interconnects with ultra-low thermal conductivity, comprising:
   a first ultra-low thermal conductivity substrate;
   a plurality of discreet high temperature superconducting lines bonded to said first substrate with an adhesive;
   a high temperature superconducting layer having first and second sides, said first side of said high temperature superconducting layer positioned to face said superconducting lines;
   a second ultra-low thermal conductivity substrate bonded to said second side of said high temperature superconducting layer; and
   a dielectric positioned between and separating said discreet high temperature superconducting lines from said high temperature superconducting layer.

2. The superconducting interconnects according to claim 1, wherein said first and second substrates are formed of a dielectric material.

3. The superconducting interconnects according to claim 2, wherein said dielectric material is a liquid crystal polymer laminate or a polyimide film or a glass epoxy laminate.

4. The superconducting interconnects according to claim 2, wherein said first and second substrates are formed of a polymeric material.

5. The superconducting interconnects according to claim 1, wherein said high temperature superconducting layer is formed of a bi-axially aligned yttrium barium copper oxide film.

6. The superconducting interconnects according to claim 1, further comprising a cryogenic epoxy for bonding said high temperature superconducting lawyer to said substrate.

7. The superconducting interconnects according to claim 1, wherein said discreet high temperature superconducting lines are spaced-apart from each other whereby each of said discreet high temperature superconducting lines defines a discreet electrical pathway.

8. The superconducting interconnects according to claim 7, wherein said discreet high temperature superconducting lines are spaced from about 20 μm to about 3,000 μm apart from each other.

9. The superconducting interconnects according to claim 8, wherein said substrates have a width of from about 10 mm to about 50 mm, and wherein from about 50 to about 100 high temperature superconducting lines are bonded to said first substrate.

10. The superconducting interconnects according to claim 7, wherein said dielectric is a dielectric coating covering said superconducting lines.

11. The superconducting interconnects according to claim 10, wherein said dielectric coating extends between said superconducting lines.

12. The superconducting interconnects according to claim 11, wherein said dielectric coating encapsulates said high temperature superconducting lines.

13. The superconducting interconnects according to claim 1, wherein each of said lines defines opposing first and second surfaces, each of said first surfaces being bonded to said first substrate.

14. The superconducting interconnects according to claim 13, wherein said dielectric has a predetermined thickness such that each of the top surfaces of said plurality of high temperature superconducting lines is spaced a preselected distance from said second surface of said second superconducting layer to define a predetermined characteristic impedance.

15. The superconducting interconnects according to claim 14, wherein said dielectric has a thickness of from about 10 μm to about 500 μm as measured between said top surfaces of said plurality of high temperature superconducting lines and said second surface of said second superconducting layer.

16. The superconducting interconnects according to claim 1, further comprising a silver contact layer deposited on said superconducting layer.

17. A method of manufacturing superconducting interconnects with ultra-low thermal conductivity, comprising:
   providing a first ultra-low thermal conductivity substrate;
   bonding a first high temperature superconducting layer to said first substrate;
   etching a plurality of discreet transmission lines within said first high temperature superconducting layer along the length thereof;
   applying a dielectric coating to cover said discrete transmission lines;
   providing a second ultra-low thermal conductivity substrate having a second high temperature superconducting layer bonded thereto; and
   joining said first and second substrates such that said second high temperature superconducting layer is positioned adjacent said dielectric coating.

18. The method according to claim 17, wherein said plurality of discreet lines includes a pair of outermost lines, said outermost lines defining a width W; and
   further comprising the step of trimming said first substrate to substantially correspond to said width W.

19. The method according to claim 17, further comprising the steps of
   i) bonding a third high temperature superconducting layer to said dielectric coating;
   ii) etching a plurality of discreet lines within said third high temperature superconducting layer along the length thereof; and
   iii) applying a second dielectric coating to cover said plurality of discreet lines formed within said third high temperature superconducting layer.

* * * * *